(12) United States Patent
Yoshimaru et al.

(10) Patent No.: US 6,606,730 B1
(45) Date of Patent: Aug. 12, 2003

(54) METHOD FOR DETERMINING AN OPTIMUM POSITION OF BLOCK PINS, AND COMPUTER PRODUCT

(75) Inventors: Kiyotake Yoshimaru, Tokyo (JP); Yoshio Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 314 days.

(21) Appl. No.: 09/717,250

(22) Filed: Nov. 22, 2000

(30) Foreign Application Priority Data

Jul. 19, 2000 (JP) ........................................ 2000-219789

(51) Int. Cl.[7] .............................................. G06F 17/50
(52) U.S. Cl. ........................................... 716/2; 702/150
(58) Field of Search .......................... 702/150, 92, 94, 702/155; 716/2, 11; 33/300; 356/138; 700/302

(56) References Cited

U.S. PATENT DOCUMENTS 6,298,468 B1 * 10/2001 Zhen .............................. 716/2
6,463,567 B1 * 10/2002 Kozai ............................. 716/2

FOREIGN PATENT DOCUMENTS

| JP | 10-125790 | 5/1998 |
|----|-----------|--------|
| JP | 2000-12692 | 1/2000 |

* cited by examiner

Primary Examiner—John Barlow
Assistant Examiner—Xiuqin Sun
(74) Attorney, Agent, or Firm—Leydig, Voit & Mayer, Ltd.

(57) ABSTRACT

Positions of the blocks on a semiconductor chip are decided. Then, positions of the block pins are provisionally decided based on the positions of the blocks. Subsequently cells are disposed within the blocks. Finally, the position of a block pin is changed to a position which is, for the block pin under consideration, based on the position of a cell that is to be connected to that block pin, of the cells disposed in the corresponding block.

7 Claims, 10 Drawing Sheets

METHOD FOR DETERMINING AN OPTIMUM POSITION OF BLOCK PINS, AND COMPUTER PRODUCT

FIELD OF THE INVENTION

The present invention relates to a method for determining the optimum position of block pins that connect blocks, and processing optimally in this relation, when producing a large scale integrated circuit having a plurality of blocks buried in a chip. This invention also relates to a computer-readable recording medium into which a program for executing the method according to the present invention with a computer is recorded.

BACKGROUND OF THE INVENTION

Hitherto, a large scale integrated circuit such as ASIC has been manufactured by preparing a plurality of blocks by using a hierarchical floor planner technique, and connecting block pins disposed in a region between the blocks.

The position determining process procedure of block pins by the conventional hierarchical floor planner will be explained with reference the flowchart shown in FIG. 13. First, the hierarchical floor planner prepares a plurality of blocks for composing a large scale integrated circuit, in a semiconductor chip (step S101). On the basis of the configuration of the blocks, block pin positions of each block are determined (step S102). Once the block pin positions are determined, cell disposition in each block is executed (step S103) When the cell disposition is completed, the block pins on the semiconductor chip are wired (step S104), and this process is finished. That is, the conventional hierarchical floor planner automatically performs the layout of blocks and wiring between blocks based on the determined block pin positions.

However, in such a conventional hierarchical floor planner, if the position of each block on the semiconductor chip is not appropriate, the wiring between blocks is redundant, and an unexpected timing error may occur depending on the wiring capacity.

Usually, for example, the layout in each block is not complete, and when determining each block pin position, the block pin position is determined only on the basis of the layout relation and connection relation between the blocks, but when the layout in each block is actually executed, since each block pin position is determined only on the basis of the layout relation and connection relation between the blocks, a cell for connecting each block pin is not always disposed near each block pin position. If the cell for connecting each block pin is not disposed near each block pin position, the wiring between the blocks is redundant.

SUMMARY OF THE INVENTION

It is an object of the present invention to provide a method for determining the optimum position of block pins capable of assuring each block pin position so that each block pin is disposed near a connection cell, and preventing occurrence of unexpected timing error, and a computer-readable recording medium recording a program for executing this method by a computer.

The method for determining the optimum position of block pins according to one aspect of this invention comprises a provisional position determining step of determining a block position to be disposed on a chip, and provisionally determining a block pin position of each block corresponding to the block position, a cell disposing step of executing a cell disposition in each block, and a pin position optimizing step of changing the position of the block pin to an optimum position corresponding to the cell connected to the block pin out of cells disposed at the cell disposing step. Thus, after determining the block position disposed on the chip, the block pin position of each block is provisionally determined at the provisional position determining step corresponding to the block position, and the cell disposition in each block is executed at the cell disposing step, then the block pin position is changed to the optimum position corresponding to the position of the cell connected to the block pin among the cells disposed at the cell disposing step, so that the distance between the block pin and the cell to which this block pin is connected may be always short.

The method for determining the optimum position of block pins according to another aspect of this invention comprises a provisional position determining step of determining a block position to be disposed on a chip, and provisionally determining a block pin position of each block corresponding to the block position, a dividing step of dividing into input and output blocks composed of cells relating to input and output logic circuits of the block pin and other internal block after provisional determination of the block pin at the provisional position determining step, an input and output block disposing step of executing a cell disposition in the input and output blocks, a pin position optimizing step of changing the block pin position to an optimum position corresponding to the cell position disposed at the input and output block disposing step, and an internal block cell disposing step of executing a cell disposition in the internal block. Thus, after determining the block position disposed on the chip, the block pin position of each block is provisionally determined at the provisional position determining step corresponding to the block position, after provisionally determining the block pin position at the provisional position determining step, the block is divided into the input and output blocks composed of cells relating to the input and output blocks of the block pin and other internal block at the dividing step, the cell disposition in the input and output blocks is executed at the input and output block disposing step, the block pin position corresponding to the cell position disposed at the input and output block disposing step is changed to the optimum position at the pin position optimizing step, and the cell disposition in the internal block is executed at the internal block cell disposing step.

Further, there are provided, an optimum adjusting step of optimally adjusting the delay timing of the input and output blocks after the block pin position is changed to the optimum position at the pin position optimizing step, and a correcting step of correcting a change portion by comparing between the cell disposition of the input and output blocks at the input and output block disposing step and the cell disposition of the input and output blocks optimally adjusted at the optimum adjusting step. Thus, after changing the block pin position to the optimum position at the pin position optimizing step, the delay timing of the input and output blocks is optimally adjusted by the optimum adjusting step, the change portion is corrected at the correcting step by comparing between the cell disposition of the input and output blocks disposed at the input and output block disposing step and the cell disposition of the input and output blocks optimally adjusted at the optimum adjusting step, and the distance between the block pin and the cell to which this block pin is connected is shortened, while the delay timing in the input and output blocks is optimally adjusted.

Further, the optimum adjusting step further adjusts the wiring delay between block pins of the block to be connected, and optimally adjusts the delay timing between other block to be connected and the internal block of the own block.

Further, the optimum adjusting step further adjusts the wiring delay between block pins of the block to be connected, and the delay of input and output blocks of other block to be connected, and optimally adjusts the delay timing between the internal block of other block to be connected and the internal block of the own block.

Further, the input and output blocks to be divided at the dividing step are input and output logic circuits between the block pin and a flip-flop circuit which forms input and output ends of the internal block.

A recording medium of the invention records a program to be executed by any one of the methods mentioned above by a computer.

According to the invention, by recording a program to be executed by any one of the methods mentioned above by a computer, the program is machine-readable, so that the operation of the method can be realized by the computer.

Other objects and features of this invention will become apparent from the following description with reference to the accompanying drawings.

DESCRIPTION OF THE PREFERRED EMBODIMENTS

Referring now to the accompanying drawings, four preferred embodiments of the method for determining the optimum position of block pins of the invention and the computer-readable recording medium recording a program for executing this method by a computer are described in detail below.

Figure 1:
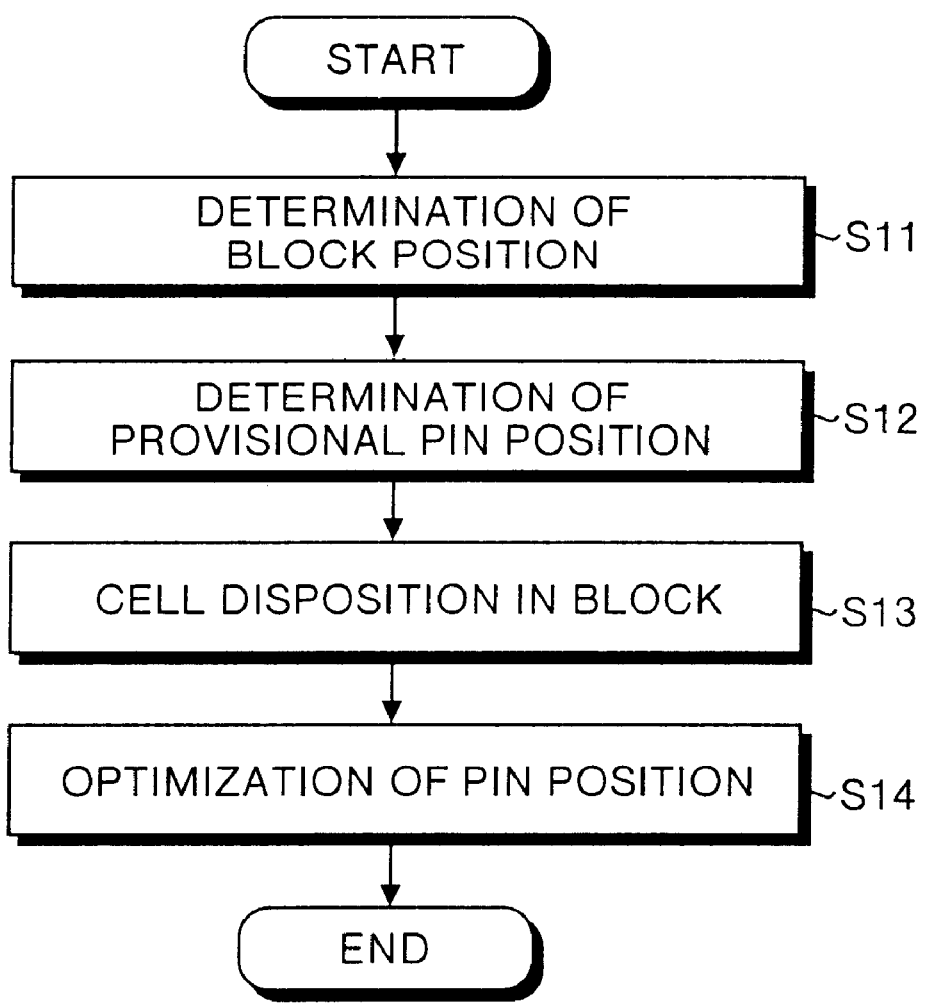
FIG. 1 is a flowchart showing a method for determining the optimum position of block pins in a first embodiment of the invention.

FIG. 1 is a flowchart showing a method for determining the optimum position of block pins in a first embodiment of the invention. As shown in FIG. 1, first, the hierarchical floor planner which is the software for automatically supporting the design of a large-scale integrated circuit determines the position of the block to be disposed on the semiconductor chip (step S11). For example, in FIG. 2, two blocks A and B are disposed on the semiconductor chip 1, and the block A is placed in the left upper position on the semiconductor chip 1, and the block B is placed in the right lower position on the semiconductor chip 1.

Consequently, the hierarchical floor planner provisionally determines the block pin positions of the disposed blocks A and B on the basis of the layout relation and connection relation of the blocks A and B (stepS12). For example, as shown in FIG. 2, the centers of gravity of the blocks A and B are linked by a straight line, and intersections 11 and 12 of this line with the blocks A, B are provisionally determined as block pin positions.

Figure 3:
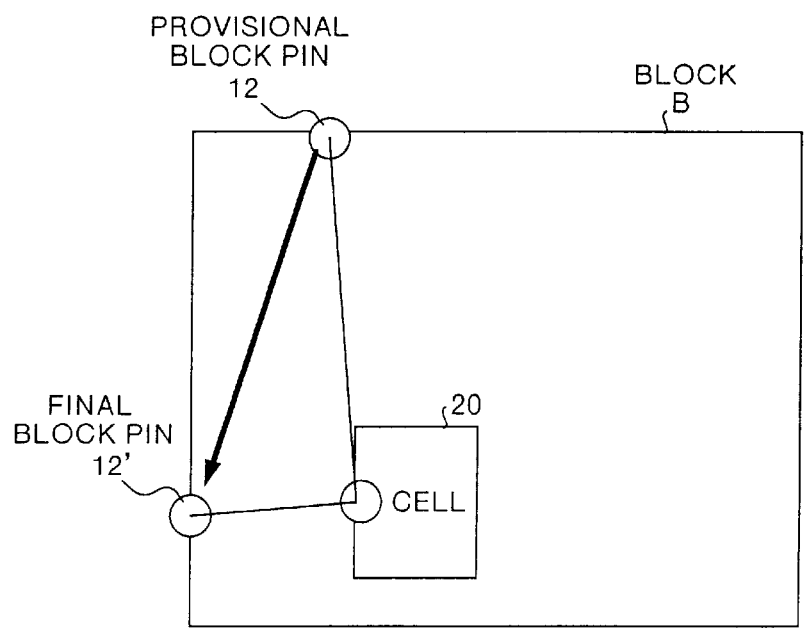
FIG. 3 is a diagram showing an example of optimization of block pin position.

After provisional determination of block pin positions, the hierarchical floor planner lays out the cell disposition in each block (step S13). Then the hierarchical floor planner moves each block pin close to the cell in the block having the connection relation with each block pin at each block pin position provisionally determined, and sets each block pin position at an optimum position (step S14), and this process is terminated. For example, as shown in FIG. 3, the position of the provisional block pin 12 provisionally determined in the block B is changed in position to final block pin 12' on the circumference of the block B closest to the cell 20 having the connection relation with this block pin 12.

Figure 2:
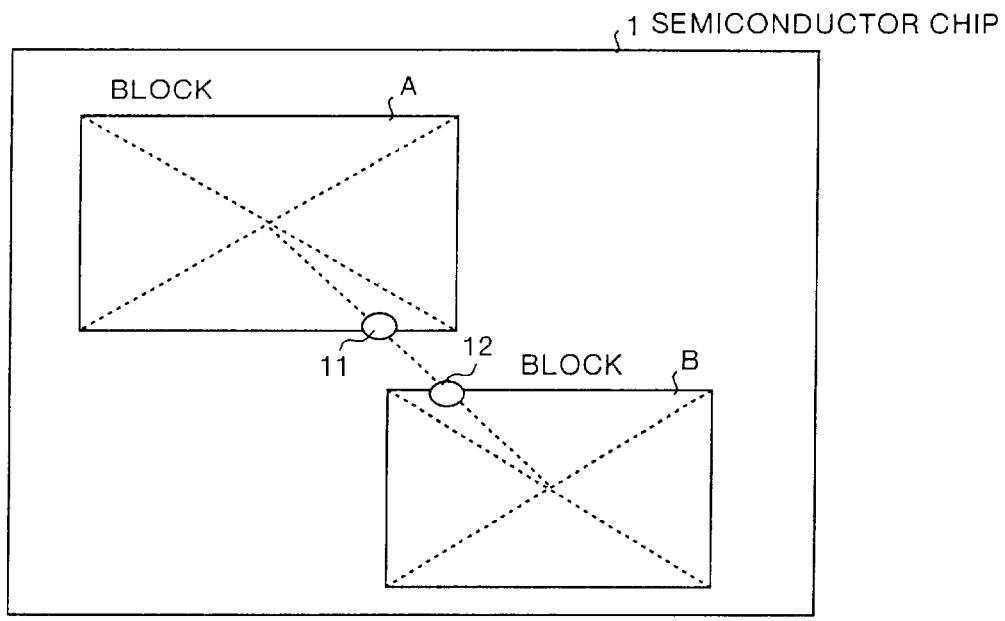
FIG. 2 is a diagram showing a configuration of blocks on a semiconductor chip, and provisional block pin position.

Incidentally, when set at the provisionally determined block pin position as shown in FIG. 2, generally, multiple cells are disposed in the block, and there are many wires for connecting between cells or cell and block pin, and the longer the distance between cell and block pin, the more disturbing the other wires, and alternative routes are likely to occur. By contrast, the wiring between block pins is smaller in the number of wires as compared with wiring in the block, and alternative routes rarely occur, and it is highly possible that the wiring is automatically created exactly as expected.

In the first embodiment, the wiring distance between the block pin in the block and the cell to be connected thereto which is likely to cause alternative routes is always short, and redundant wiring in the block rarely occurs, and occurrence of unexpected timing error can be suppressed.

A second embodiment of the invention will be explained here. In the above-explained first embodiment, each block pin position is optimized by bringing closer to the cell to be connected to each block pin, whereas in the second embodiment it is designed to shorten the time required for optimizing the block pin positions by dividing preliminarily into the input and output blocks which are input and output logic circuits relating to the block pin, and an internal block other than the input and output blocks.

Figure 4:
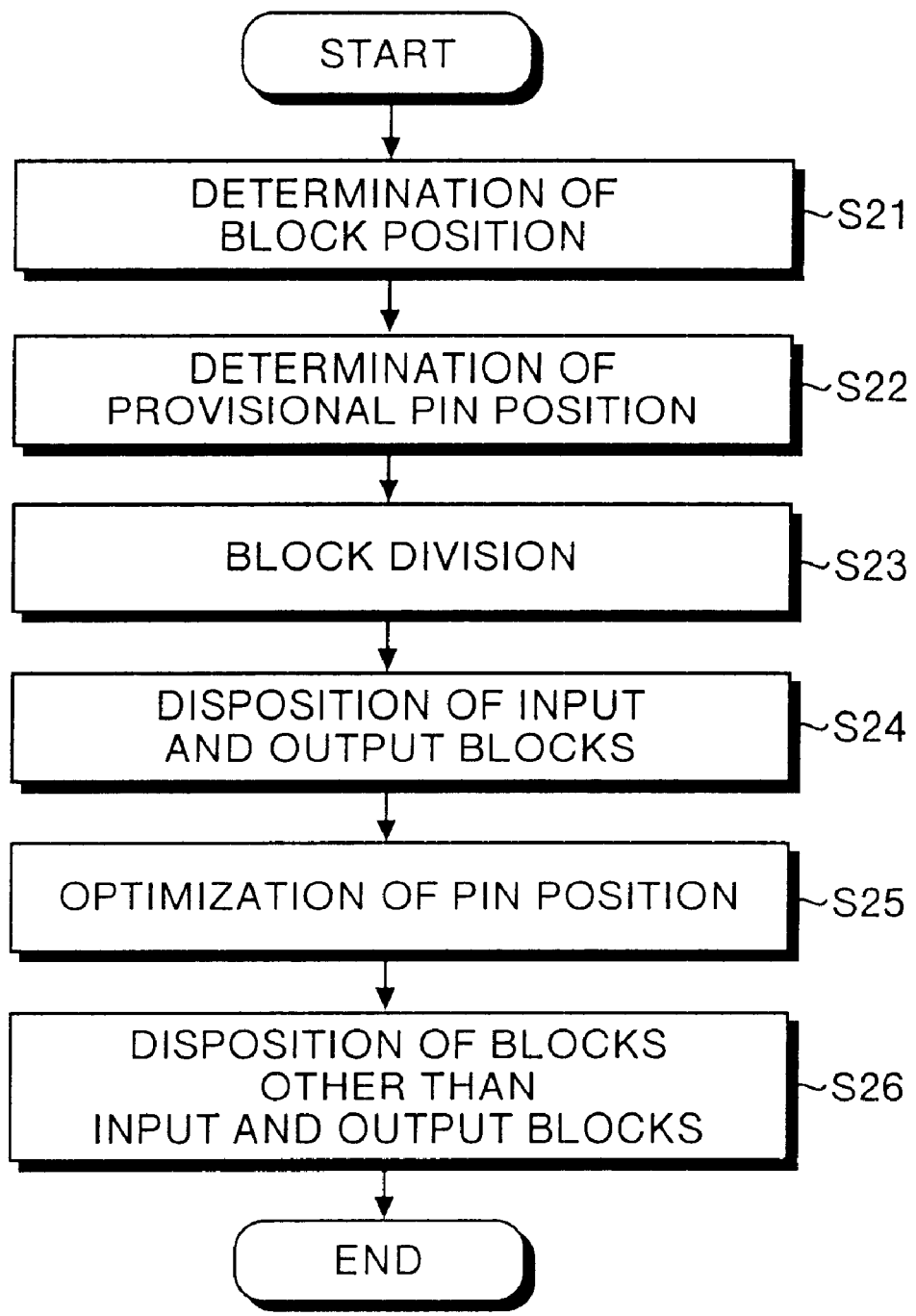
FIG. 4 is a flowchart showing a method for determining the optimum position of block pins in a second embodiment of the invention.

FIG. 4 is a flowchart showing a method for determining the optimum position of block pins in the second embodiment of the invention. As shown in FIG. 4, first, the hierarchical floor planner which is the software for automatically supporting the design of a large-scale integrated circuit determines, same as at step S11, the position of the block to be disposed on the semiconductor chip (step S21). Then, the hierarchical floor planner, same as at step S12, provisionally determines the block pin positions of the disposed blocks on the basis of the layout relation and connection relation of the blocks (step S22).

Figure 5:
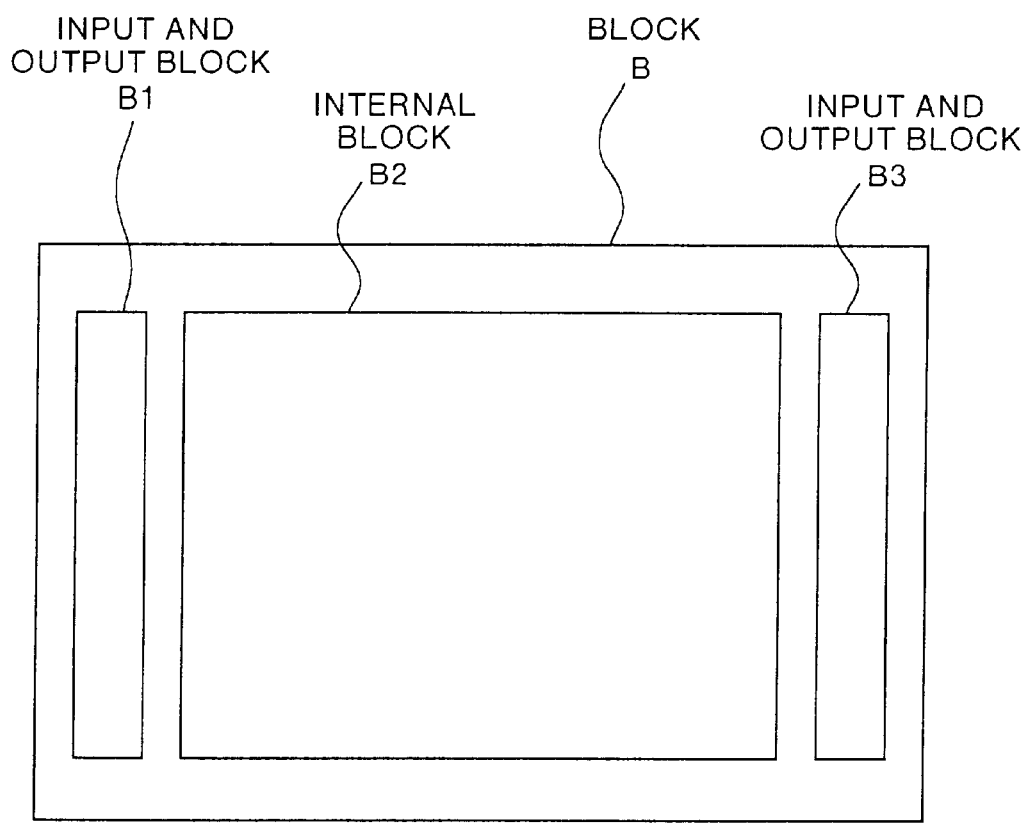
FIG. 5 is a diagram showing an example of block division in the second embodiment of the invention.

Next, the hierarchical floor planner divides the inside of each block into the input and output blocks which are input and output logic circuits relating to each block pin, and an internal block other than the input and output blocks (step S23). For example, as shown in FIG. 5, the logic in the block B is divided into input and output blocks B1, B3 relating to the block pins, and an internal block B2 other than the input and output blocks B1, B3. That is, it is divided into the input and output blocks B1, B3 which are cell groups relating to the block pins, and the internal block B2 which is a cell group other than these cell groups. In this case, the input and output blocks B1, B3 are disposed around the block B.

Then the hierarchical floor planner lays out the cell disposition in the divided input and output blocks B1, B3 (step S24). Further, same as at step S14, the hierarchical floor planner changes the block pin positions provisionally determined at step S22 to optimum positions (step S25). Moreover, the hierarchical floor planner disposes the cells of the internal block B2 other than the input and output blocks B1, B3 (step S26), and terminates the process.

According to the second embodiment, since the block is divided into input and output blocks and an internal block, and the block pin positions are optimized between the cells in the input and output blocks, and between the block pins, the time required for optimizing the block pin positions can be shortened.

A third embodiment of the invention will be explained here. In the second embodiment, the block pin positions are optimized by dividing into input and output blocks having cells to be connected to each block pin, and an internal block having other cells, whereas in the third embodiment it is designed to adjust further the delay timing in the input and output blocks optimally.

Figure 6:
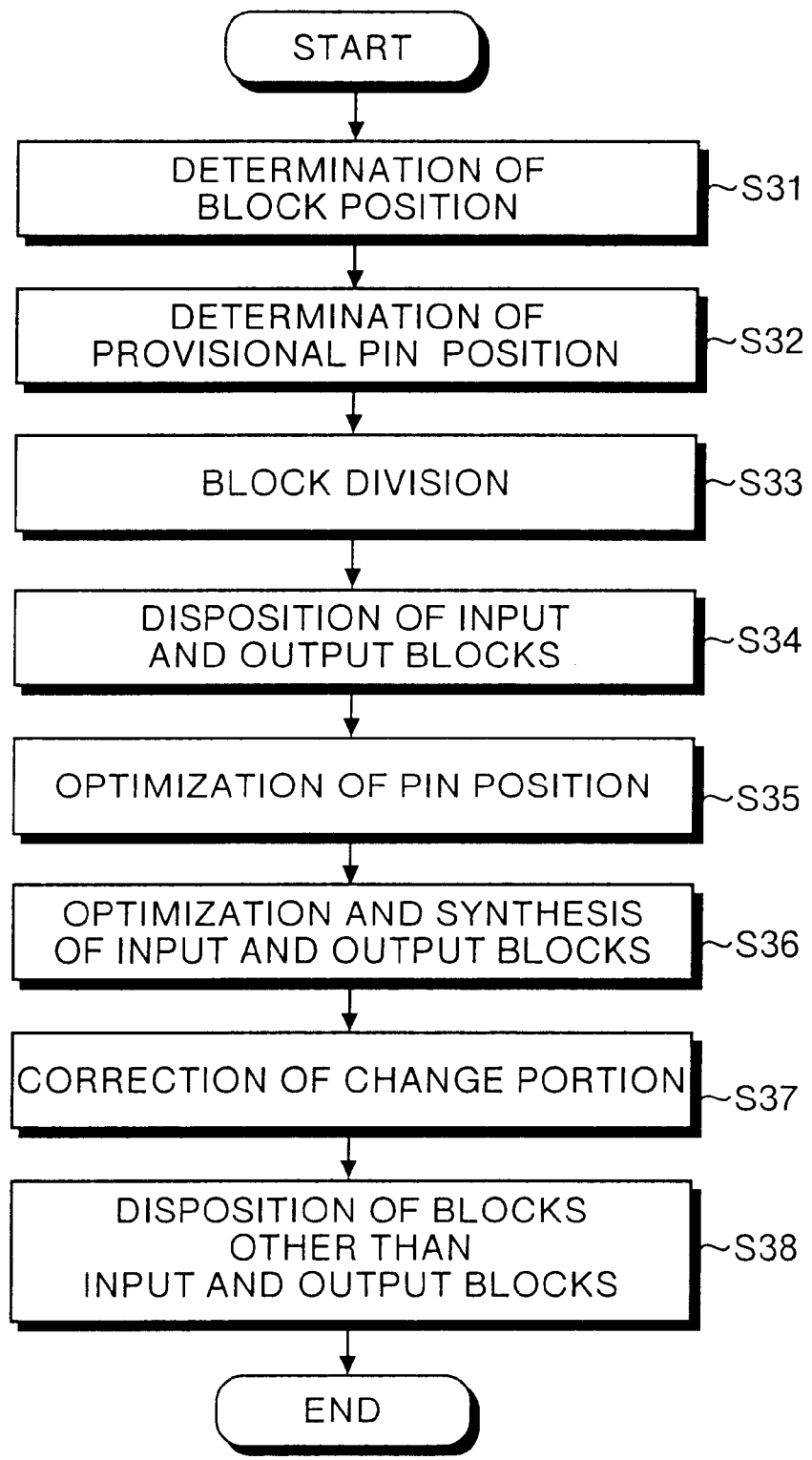
FIG. 6 is a flowchart showing a method for determining the optimum position of block pins in a third embodiment of the invention.

FIG. 6 is a flowchart showing a method for determining the optimum position of block pins in the third embodiment of the invention. As shown in FIG. 6, first, the hierarchical floor planner which is the software for automatically supporting the design of a large-scale integrated circuit determines, same as at step S21, the position of the block to be disposed on the semiconductor chip (step S31). Then, the hierarchical floor planner, same as at step S22, provisionally determines the block pin positions of the disposed blocks on the basis of the layout relation and connection relation of the blocks (step S32).

Next, the hierarchical floor planner divides the inside of each block into the input and output blocks which are input and output logic circuits relating to each block pin, and an internal block other than the input and output blocks (step S33). However, at step S23 in the second embodiment, the block has been divided into the input and output blocks and internal block only in order to determine the block pin positions, but at step S33 in the third embodiment, it is divided into the input and output blocks and internal block in order to optimize the delay timing of the input and output blocks as mentioned below.

Then, same as at step S24, the cell disposition is laid out in the divided input and output blocks (step S34). Further, same as at step S25, the hierarchical floor planner changes the block pin positions provisionally determined at step S32 to optimum positions (step S35). Later, the hierarchical floor planner changes the logic in the input and output blocks, and optimizes and synthesizes so as to adjust the delay timing between the block pin and the internal block optimally (S36). Moreover, the hierarchical floor planner compares the cell disposition of the input and output blocks disposed at step S34 and the cell disposition of input and output blocks changed at step S36, and, if there is a change portion, corrects the change portion in the input and output blocks (step S37). Then the cell disposition is laid out in the internal block other than the input and output blocks (S38), and the process is terminated.

Figure 7:
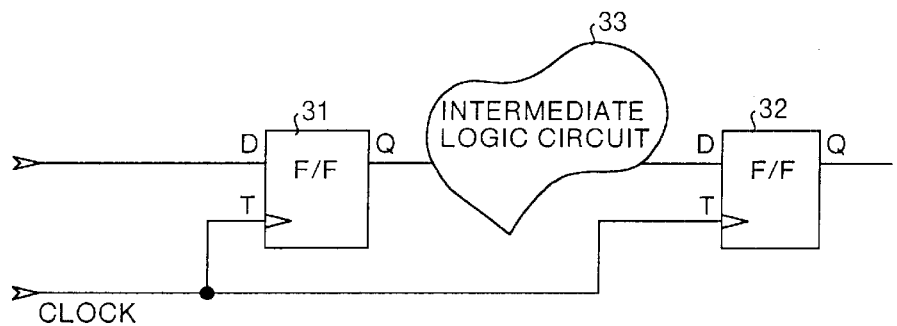
FIG. 7 is a diagram explaining delay timing.
Figure 8:
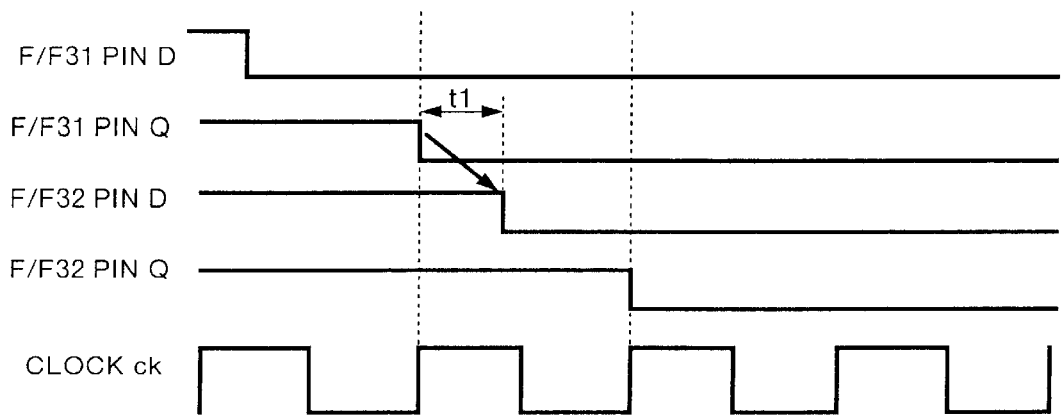
FIG. 8 is a timing chart explaining delay timing adjustment.

Herein, the delay timing of the input and output blocks is explained by referring to FIG. 7 and FIG. 8. As shown in FIG. 7, an intermediate logic circuit 33 exists between flip-flop circuits 31 and 32. This intermediate logic circuit 33 corresponds, for example, to the input and output blocks. The flip-flop circuit 31 corresponds to the flip-flop circuit in other block, and the flip-flop circuit 32 corresponds to the flip-flop circuit in the own block.

In FIG. 8, the flip-flop circuit 31 issues the data taken in at pin D to pin Q at the rise of clock CK. In this case, the output data of the flip-flop circuit 31 must be received in the flip-flop circuit 32 until the rise of next clock CK is put into pin T of the flip-flop circuit 32. That is, within one period of the clock CK, the output data of the flip-flop circuit 31 must reach the flip-flop circuit 32 of the next stage. That is, the period t1 must be adjusted.

Figure 9:
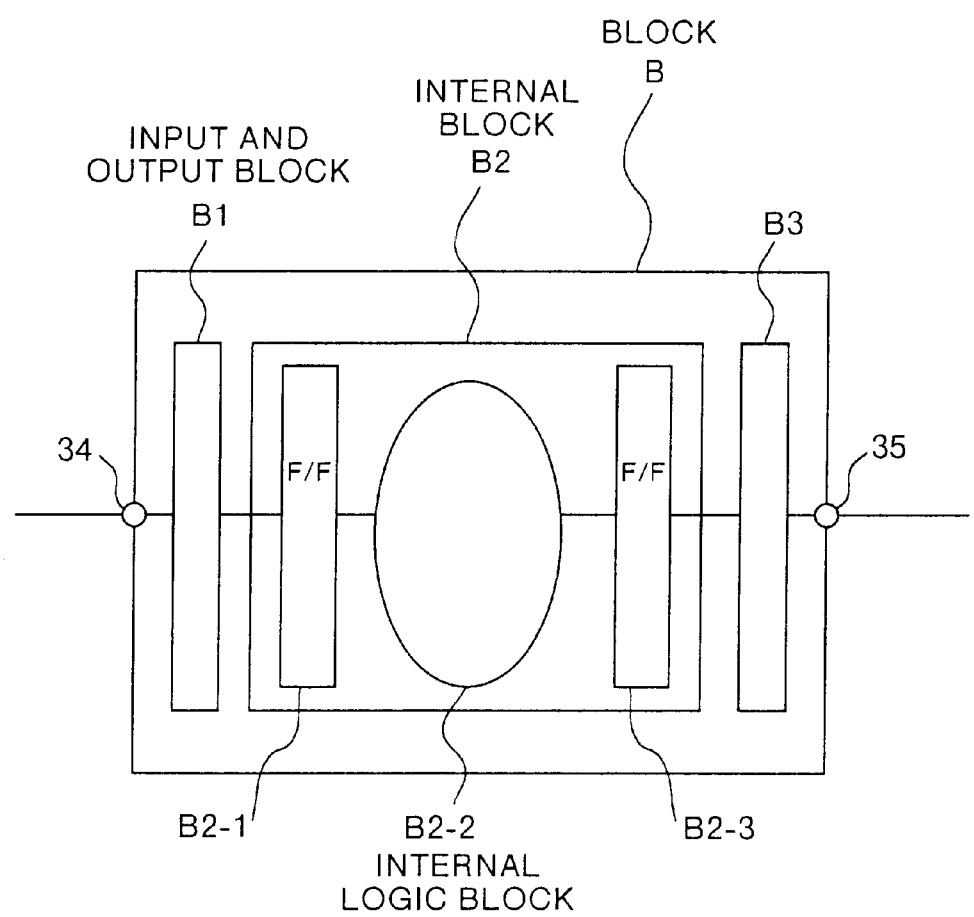
FIG. 9 is a diagram showing an example of block division in the third embodiment of the invention.

Herein, as shown in FIG. 9, when dividing block B into input and output blocks B, B3 and internal block B2, flip-flop circuits B2-1, B2-3 in the internal block B2 are determined as the boundary of the input and output blocks B, B3 and the internal block B2. That is, from the internal block B2, the flip-flop circuits B2-1, B2-3 as the boundary for delay timing adjustment of input and output blocks B1, B3 are separated ad extracted, so as to be separated from the internal logic circuit B2-2.

Then, the hierarchical floor planner, at step S36, optimally adjusts the delay timing between the block pin 34 and flip-flop circuit B2-1, and the delay timing between the block pin 35 and flip-flop circuit B2-3. This optimum adjustment can be achieved by inserting a cell, for example, a buffer into the input and output blocks B1, B3.

According to the third embodiment, since the input and output blocks B1, B3 relating to the block pins are extracted from the block B, and the block pin positions are optimized and the delay timing of the input and output blocks is optimally adjusted, the layout of the larger-scale integrated circuit of much lower incidence of delay timing error can be designed.

A fourth embodiment of the invention will be explained now. In the third embodiment, the delay timing is optimally adjusted in the input and output blocks in each block, whereas in the fourth embodiment it is designed to adjust the delay timing optimally, including the wiring between blocks and other blocks.

Figure 10:
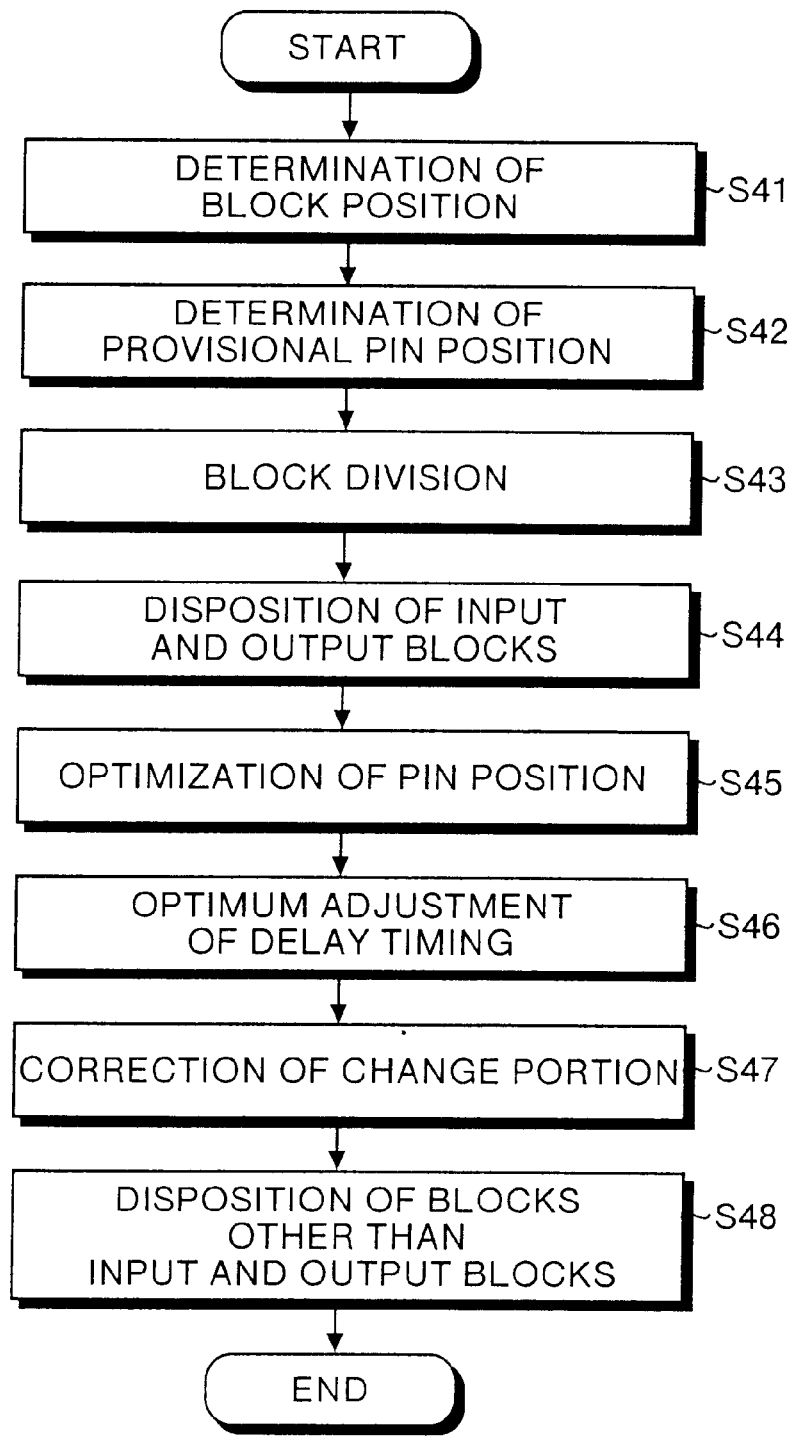
FIG. 10 is a flowchart showing a method for determining the optimum position of block pins in a fourth embodiment of the invention.

FIG. 10 is a flowchart showing a method for determining the optimum position of block pins in the fourth embodiment of the invention. In the fourth embodiment, step S36 in the third embodiment is replaced by step S46 for optimally adjusting the delay timing in consideration of also the wiring delay between block pins. Other steps S41 to S45, S47, and S48 correspond to steps S31 to S35, S37, and S38.

Figure 11:
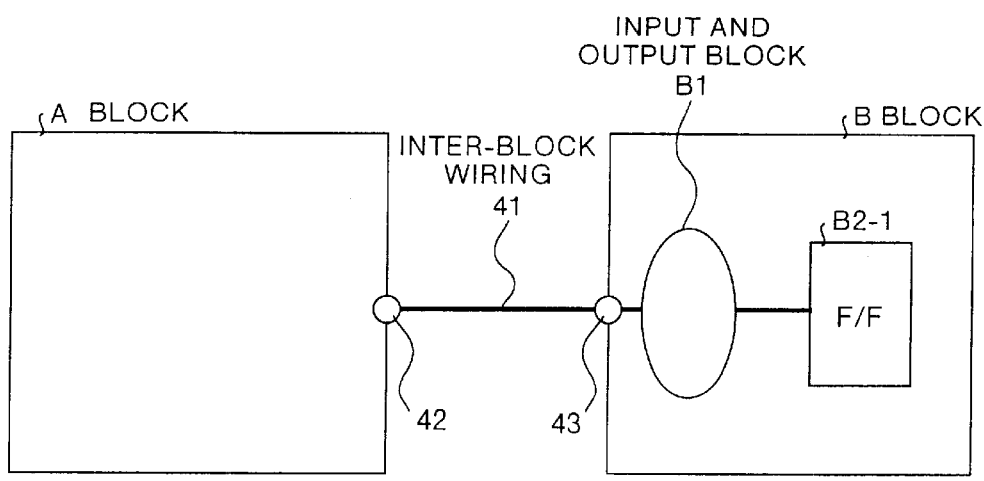
FIG. 11 is a diagram showing an example of delay timing adjustment in the fourth embodiment of the invention.

At step S46, as shown in FIG. 11, in consideration of wiring delay of an inter-block wiring 41 for connecting between the block pins 43 and 42 of the own block B and other block A, the delay timing of the input and output blocks B1 is optimally adjusted. That is, the delay timing from the block pin 42 to the flip-flop circuit B2-1 is optimally adjusted.

Figure 12:
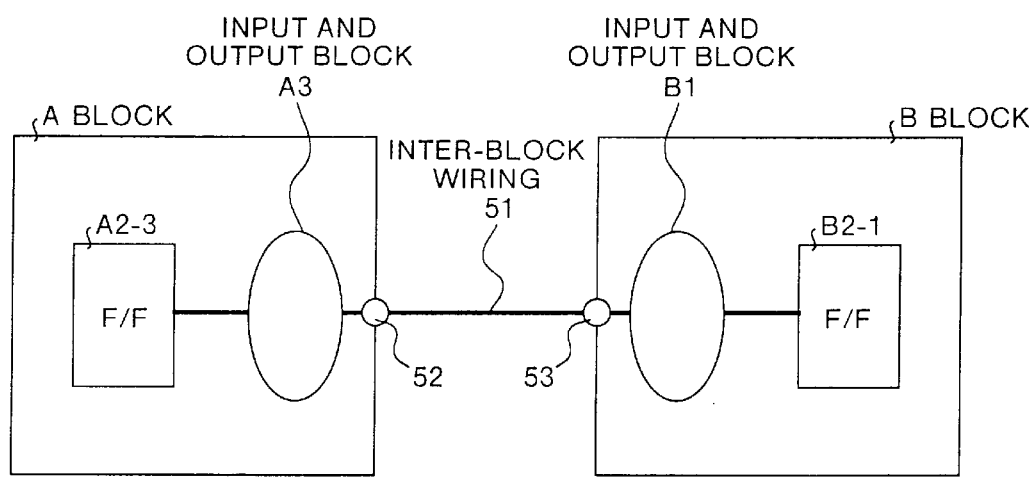
FIG. 12 is a diagram showing an example of delay timing adjustment in the fourth embodiment of the invention.
Figure 13:
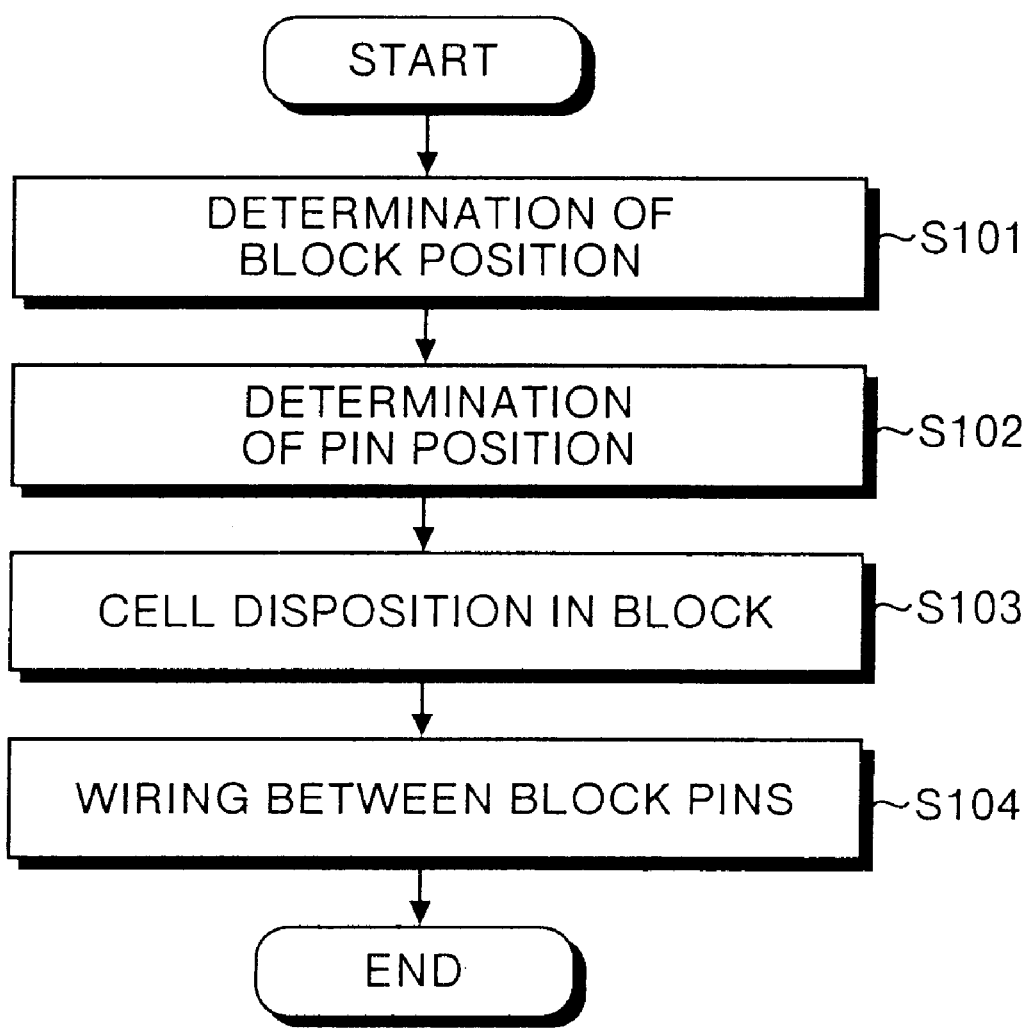
FIG. 13 is a flowchart showing a conventional method for determining the optimum position of block pins.

Also as shown in FIG. 12, in consideration of an inter-block wiring 51 for connecting between the block pins 53 and 52 of the own lock B and other block A, and the input and output blocks A3 between he flip-flop circuit A2-3 of other block A and block pin 52, the delay timing from the flip-flop circuit A2-3 to the flip-flop circuit B2-1 may be optimally adjusted.

Thus, according to the fourth embodiment, without making optimum adjustment of delay timing of the input and output blocks B1 in the own block B, by adjusting the wiring delay between the block pins, or the wiring delay between block pins and delay timing of the input and output blocks A3 in other block A, the delay timing can be adjusted more optimally.

In the first to fourth embodiments, the optimum position of the block pins is determined by the hierarchical floor planner, and this processing method may be realized by recording it as a program to be executed by a computer, in a computer-readable recording medium.

As explained herein, according to one aspect of the present invention, after determining the block position disposed on the chip, the block pin position of each block is provisionally determined at the provisional position determining step corresponding to the block position, and the cell disposition in each block is executed at the cell disposing step, then the block pin position is changed to the optimum position corresponding tot he position of the cell connected to the block pin among the cells disposed at the cell disposing step, so that the distance between the block pin and the cell to which this block pin is connected may be always short, and therefore redundant wiring hardly occurs in the block, and occurrence of unexpected timing error can be suppressed.

According to another aspect of the present invention, after determining the block position disposed on the chip, the block pin position of each block is provisionally determined at the provisional position determining step corresponding to the block position, after provisionally determining the block pin position at the provisional position determining step, the block is divided into the input and output blocks composed of cells relating to the input and output blocks of the block pin and other internal block at the dividing step, the cell disposition in the input and output blocks is executed at the input and output block disposing step, the block pin position corresponding to the cell position disposed at the input and output block disposing step is changed to the optimum position at the pin position optimizing step, and the cell disposition in the internal block is executed at the internal block cell disposing step, and therefore the time required for optimization of block pin can be shortened.

Further, after changing the block pin position to the optimum position at the pin position optimizing step, the delay timing of the input and output blocks is optimally adjusted by the optimum adjusting step, the change portion is corrected at the correcting step by comparing between the cell disposition of the input and output blocks disposed at the input and output block disposing step and the cell disposition of the input and output blocks optimally adjusted at the optimum adjusting step, and the distance between the block pin and the cell to which this block pin is connected is shortened, while the delay timing in the input and output blocks is optimally adjusted, and therefore occurrence of unexpected timing error can be further suppressed.

Further, the optimum adjusting step further adjusts the wiring delay between block pins to the block to be connected, and optimally adjusts the delay timing between other block to be connected and the internal block of the own block, and therefore occurrence of unexpected timing error can be further suppressed.

Further, the optimum adjusting step further adjusts the wiring delay between block pins to the block to be connected, and the delay of the input and output blocks of other block to be connected, and optimally adjusts the delay timing between the internal block of other block to be connected and the internal block of the own block, and therefore occurrence of unexpected timing error can be further suppressed.

Further, the input and output blocks to be divided at the dividing step are input and output logic circuits between the block pin and the flip-flop circuit which forms input and output ends of the internal block, and therefore it is divided as appropriate input and output blocks, so that occurrence of unexpected timing error can be securely suppressed.

According to still another aspect of the present invention, by recording a program to be executed by any one of the methods mentioned above by a computer, the program is machine-readable, and therefore the operation of the method can be realized by the computer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method for determining positions of block pins comprising:

determining positions of blocks to be disposed on a chip, and provisionally determining positions of block pins of each block based on the positions of the blocks;

disposing cells in each block; and changing a position of a block pin to a position that is closest to a cell that is to be connected to that block pin, of the cells in the block.

2. A method for determining positions of block pins comprising:

determining positions of blocks to be disposed on a chip, and provisionally determining positions of block pins of each block based on the positions of the blocks;

dividing the blocks into input and output blocks, and internal blocks after provisionally determining positions of the block pins, wherein the input and output blocks are the blocks composed of cells relating to input and output logic circuits of the blocks;

positioning cells in the input and output blocks;

changing a position of a block pin to a position that is closest to a cell in the input and output blocks; and positioning cells in the internal blocks.

3. The method for determining positions of block pins according to claim 2, further comprising:

adjusting delay timing in the input and output blocks after the position of the block pin has been changed; and comparing cell positioning of the input and output blocks before and after adjusting the delay timing, and correcting the position of the block pin if the cell positions are different.

4. The method for determining positions of block pins according to claim 3, wherein, in the adjusting, further adjusting wiring delay between block pins of one block to be connected, and adjusting the delay timing between another block to be connected and an internal block.

5. The method for determining positions of block pins according to claim 3, wherein, in adjusting, further adjusting wiring delay between block pins of the block to be connected and the delay of input and output blocks of another block to be connected, and adjusting the delay timing between an internal block of another block to be connected and an internal block.

6. The method for determining positions of block pins according to claim 2, wherein the input and output blocks divided are input and output logic circuits between the block pin and a flip-flop circuit an internal block.

7. A computer readable medium storing instructions, which, when executed by a computer, causes the computer to:

determine positions of blocks to be disposed on a chip;

provisionally determine positions of block pins of each block based on the positions of the blocks;

dispose cells in each block; and change a position of a block pin to a position that is closest to a cell that is to be connected to that block pin, of the cells in the block.

* * * * *